United States Patent
King

(10) Patent No.: US 7,095,659 B2
(45) Date of Patent: Aug. 22, 2006

(54) VARIABLE VOLTAGE SUPPLY BIAS AND METHODS FOR NEGATIVE DIFFERENTIAL RESISTANCE (NDR) BASED MEMORY DEVICE

(75) Inventor: Tsu-Jae King, Fremont, CA (US)

(73) Assignee: Progressant Technologies, Inc., Mountain View, CA (US)

( * ) Notice: Subject to any disclaimer, the term of this patent is extended or adjusted under 35 U.S.C. 154(b) by 0 days.

(21) Appl. No.: 11/243,346

(22) Filed: Oct. 3, 2005

(65) Prior Publication Data

US 2006/0028881 A1   Feb. 9, 2006

Related U.S. Application Data

(63) Continuation-in-part of application No. 11/010,132, filed on Dec. 9, 2004, now Pat. No. 7,012,842, which is a continuation of application No. 10/185,247, filed on Jun. 28, 2002, now Pat. No. 6,847,562.

(51) Int. Cl.
*G11C 5/14* (2006.01)
(52) U.S. Cl. .......................... 365/189.09; 365/189.07; 365/189.11
(58) Field of Classification Search .......... 365/189.09, 365/189.07, 189.08, 189.11, 189.03
See application file for complete search history.

(56) References Cited

U.S. PATENT DOCUMENTS

| | | |
|---|---|---|
| 3,588,736 A | 6/1971 | McGroddy |
| 3,903,542 A | 9/1975 | Nathanson et al. |
| 3,974,486 A | 8/1976 | Curtis et al. |
| 4,047,974 A | 9/1977 | Harari |
| 4,143,393 A | 3/1979 | DiMaria et al. |
| 4,644,386 A | 2/1987 | Nishizawa et al. |
| 4,806,998 A | 2/1989 | Vinter et al. |
| 4,945,393 A | 7/1990 | Beltram et al. |
| 5,021,841 A | 6/1991 | Leburton et al. |
| 5,023,836 A | 6/1991 | Mori |
| 5,032,891 A | 7/1991 | Takagi et al. |
| 5,084,743 A | 1/1992 | Mishra et al. |
| 5,093,699 A | 3/1992 | Weichold et al. |

(Continued)

FOREIGN PATENT DOCUMENTS

EP   0747940 A2   12/1996

(Continued)

OTHER PUBLICATIONS

Barlow, P.S. et al., "Negative differential output conductance of self-heated power MOSFETs,"IEE Proceedings-1 Solid-State and Electron Devices, vol. 133, Part 1, No. 5, Oct. 1986, pp. 177-179.

(Continued)

*Primary Examiner*—Richard Elms
*Assistant Examiner*—Hien N Nguyen
(74) *Attorney, Agent, or Firm*—Bever, Hoffman & Harms, LLP; Jeanette S. Harms

(57) ABSTRACT

Static random access memory (SRAM) performance is enhanced through the use of appropriate latch strength control. For example, latch strength in an SRAM cell is increased during data store operations to reduce power dissipation and improve reliability. Latch strength can also be increased to improve read speed, while latch strength can be reduced to improve write speed. In an SRAM cell including at least a negative differential resistance (NDR) device as a pull-up element, this type of latch control can be achieved through appropriate biasing of the NDR device(s). For example, drain-to-source bias can be increased or decreased to increase or decrease, respectively, latch strength. Similarly, gate-to-source bias can be increased or decreased to increase or decrease, respectively, latch strength.

24 Claims, 6 Drawing Sheets

U.S. PATENT DOCUMENTS

| | | | |
|---|---|---|---|
| 5,130,763 A | 7/1992 | Delhaye et al. |
| 5,162,880 A | 11/1992 | Hazama et al. |
| 5,189,499 A | 2/1993 | Izumi et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |
| 5,543,652 A | 8/1996 | Ikeda et al. |
| 5,552,622 A | 9/1996 | Kimura |
| 5,606,177 A | 2/1997 | Wallace et al. |
| 5,633,178 A | 5/1997 | Kalnitsky |
| 5,689,458 A | 11/1997 | Kuriyama |
| 5,698,997 A | 12/1997 | Williamson, III et al. |
| 5,705,827 A | 1/1998 | Baba et al. |
| 5,732,014 A | 3/1998 | Forbes |
| 5,761,114 A | 6/1998 | Bertin et al. |
| 5,770,958 A | 6/1998 | Arai et al. |
| 5,773,996 A | 6/1998 | Takao |
| 5,798,965 A | 8/1998 | Jun |
| 5,804,475 A | 9/1998 | Meyer et al. |
| 5,843,812 A | 12/1998 | Hwang |
| 5,869,845 A | 2/1999 | Van der Wagt et al. |
| 5,883,549 A | 3/1999 | De Los Santos |
| 5,883,829 A | 3/1999 | Van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,945,706 A | 8/1999 | Jun |
| 5,953,249 A | 9/1999 | Van der Wagt |
| 5,959,328 A | 9/1999 | Krautschneider et al. |
| 5,962,864 A | 10/1999 | Leadbeater et al. |
| 6,015,739 A | 1/2000 | Gardner et al. |
| 6,015,978 A | 1/2000 | Yuki et al. |
| 6,075,265 A | 6/2000 | Goebel et al. |
| 6,077,760 A | 6/2000 | Fang et al. |
| 6,084,796 A | 7/2000 | Kozicki et al. |
| 6,091,077 A | 7/2000 | Morita et al. |
| 6,097,036 A | 8/2000 | Teshima et al. |
| 6,104,631 A | 8/2000 | El-Sharawy et al. |
| 6,128,216 A | 10/2000 | Noble, Jr. et al. |
| 6,130,559 A | 10/2000 | Balsara et al. |
| 6,150,242 A | 11/2000 | Van der Wagt et al. |
| 6,184,539 B1 | 2/2001 | Wu et al. |
| 6,205,054 B1 | 3/2001 | Inami |
| 6,222,766 B1 | 4/2001 | Sasaki et al. |
| 6,225,165 B1 | 5/2001 | Noble, Jr. et al. |
| 6,246,606 B1 | 6/2001 | Forbes et al. |
| 6,261,896 B1 | 7/2001 | Jun |
| 6,294,412 B1 | 9/2001 | Krivokapic |
| 6,301,147 B1 | 10/2001 | El-Sharawy et al. |
| 6,303,942 B1 | 10/2001 | Farmer |
| 6,310,799 B1 | 10/2001 | Duane et al. |
| 6,353,251 B1 | 3/2002 | Kimura |
| 6,396,731 B1 | 5/2002 | Chou |
| 6,404,018 B1 | 6/2002 | Wu et al. |
| 6,424,174 B1 | 7/2002 | Nowak et al. |
| 6,448,161 B1 | 9/2002 | Krivokapic |
| 6,472,263 B1 | 10/2002 | Noble |
| 6,479,862 B1 | 11/2002 | King et al. |
| 6,490,193 B1 | 12/2002 | van der Wagt et al. |
| 6,512,274 B1 | 1/2003 | King et al. |
| 6,529,400 B1 | 3/2003 | Bhavnagarwala et al. |
| 6,567,292 B1 | 5/2003 | King |
| 6,596,617 B1 | 7/2003 | King et al. |
| 6,683,805 B1 | 1/2004 | Joshi et al. |
| 6,765,822 B1 * | 7/2004 | Uemura ..................365/159 |
| 2001/0005327 A1 | 6/2001 | Duane et al. |
| 2001/0013621 A1 | 8/2001 | Nakazato |
| 2001/0019137 A1 | 9/2001 | Koga et al. |
| 2001/0024841 A1 | 9/2001 | Noble, Jr. et al. |
| 2001/0053568 A1 | 12/2001 | Deboy et al. |
| 2002/0017681 A1 | 2/2002 | Inoue et al. |
| 2002/0048190 A1 | 4/2002 | King |
| 2002/0054502 A1 | 5/2002 | King |
| 2002/0057123 A1 | 5/2002 | King |
| 2002/0063277 A1 | 5/2002 | Ramsbey et al. |
| 2002/0066933 A1 | 6/2002 | King |
| 2002/0067651 A1 | 6/2002 | King |
| 2002/0076850 A1 | 6/2002 | Sadd et al. |
| 2002/0093030 A1 | 7/2002 | Hsu et al. |
| 2002/0096723 A1 | 7/2002 | Awaka |
| 2002/0100918 A1 | 8/2002 | Hsu et al. |
| 2002/0109150 A1 | 8/2002 | Kajiyama |

FOREIGN PATENT DOCUMENTS

| | | |
|---|---|---|
| EP | 0747961 A2 | 12/1996 |
| EP | 0655788 B1 | 1/1998 |
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| EP | 1251562 A1 | 10/2002 |
| JP | 8018033 A2 | 1/1996 |
| JP | 2001 01015757 A2 | 1/2001 |
| WO | WO 90/03646 A1 | 4/1990 |
| WO | WO 99/63598 A1 | 4/1999 |
| WO | WO 00/41309 A1 | 7/2000 |
| WO | WO 01/65597 A1 | 9/2001 |
| WO | WO 01/69607 A2 | 9/2001 |
| WO | WO 01/88977 A2 | 11/2001 |
| WO | WO 01/99153 A2 | 12/2001 |

OTHER PUBLICATIONS

Le Neel, O. et al., "Electrical Transient Study of Negative Resistance in SOI MOS Transistors," Electronics Letters, vol. 26, No. 1, pp. 73-74, Jan. 1990.

Mohan, S. et al., "Ultrafast Pipelined Adders Using Resonant Tunneling Transistors," IEE Electronics Letters, vol. 27, No. 10, May 1991, pp. 830-831.

Zhang, J.F. et al., "Electron trap generation in thermally grown SIO2 under Fowler-Nordheim stress," J. Appl. Phys 71 (2), Jan. 15, 1992, pp. 725-734.

Zhang, J.F. et al., "A quantitative investigation of electron detrapping in SiO2 under Fowler-Nordheim stress," J. Appl. Phys. 71(12), Jun. 15, 1992, pp. 5989-5996.

Zhang, J.F. et al., "A comparative study of the electron trapping and thermal detrapping in SIO2 prepared by plasma and thermal oxidation," J. Appl. Phys. 72 (4), Aug. 15, 1992, pp. 1429-1435.

Luryi, S. et al., "Collector-Controlled States and the Formation of Hot Electron Domains in Real-Space Transfer Transistors" AT&T Bell Laboratories, pp. 1-7, 1992.

Luryi, S. et al., "Light-emitting Logic Devices based on Real Space Transfer In Complementary InGaAs/InAiAs Heterostructures" In "Negative Differential Resisitance and Instabilities in 2D Semiconductors", ed. by N. Balkan, B. K. Ridley, and A.J. Vickers, NATO ASI Series [Physics] B 307, pp. 53-82, Plenum Press (New York 1993).

Mohan, S. et al., "Logic Design Based on Negative Differential Resistance Characteristics of Quantum Electronic Devices,"IEE Proceedings-G: Electronic Devices, vol. 140, No. 6, Dec. 1993, pp. 383-391.

Mohan, S. et al., "Ultrafast Pipelined Arithmetic Using Quantum Electronic Devices," IEE Proceedings-E: Computers and Digital Techniques, vol. 141, No. 2, Mar. 1994, pp. 104-110.

Chan, E. et al., "Compact Muliple-Valued Multiplexers Using Negative Differential Resistance Devices," IEEE Journal of Solid-State Circuits, vol. 31, No. 8, Aug. 1996, pp. 1151-1156.

Chan, et al., "Mask Programmable Multi-Valued Logic Gate Using Resonant Tunneling Diodes," IEE Proceedings-Circuits Devices Syst., vol. 143, No. 5, Oct. 1996, pp. 289-294.

Shao, Z et al., "Transmission Zero Engineering in Lateral Double-Barrier Resonant Tunneling Devices," Dept. Of Electrical Engineering, University of Notre Dame, pp. 1-7 (1996).

Goldhaber-Gordon, David et al., "Overview of nanoelectronic devices," Proc. IEEE, 85(4), Apr. 1997, pp. 521-540.

Koester, S. J. et al., "Negative Differential Conductance in Lateral Double-Barrier Transistors Fabricated in Strained Si Quantum Wells," Applied Physics Letters, vol. 70, No. 18, May 1997, pp. 2422-2424.

Dozsa, et al., "A transient method for measuring current-voltage characteristics with negative differential resistance regions," Research Institute for Technical Physics, P.O. Box 76, H-1325 Budapest, Hungary, (Received Jul. 24, 1997; accepted Aug. 1, 1997), 2 pages.

Pacha, C. et al., "Design of Arithmetic Circuits using Resonant Tunneling Diodes and Threshold Logic,"Lehrstuhl Bauelmente der Elektrotechnik, Universitat Dortmund, pp. 1-11, Sep. 1997.

Hansch, W. et al., "The planar-doped-barrier-FET: MOSFET overcomes conventional limitations," ESSDERC '97 27th European Solid-State Device Research Conference, Stuttgart, Sep. 22-24, 1997, 4 pages.

Wirth, G. et al., "Periodic transconductance oscillations in sub-100nm MOSFETs," ESSDERC '97 27th European Solid-State Device Research Conference, Stuttgart, Sep. 22-24, 1997, 4 pages.

Haddad, G.I. et al., "Tunneling Devices and Applications in High Functionality/Speed Digital Circuits," Solid State Electronics, vol. 41, No. 10, Oct. 1997, pp. 1515-1524.

Gardner, C. et al., "Smooth Quantum Hydrodynamic Model Simlulation of the Resonant Tunneling Diode," Dept. Of Mathematics Arizona State University, pp. 1-5, (1998).

Jungel, A. et al., "Numerical Simulation of Semiconductor Devices: Energy-Transport and Quantum Hydrodynamic Modeling,"Fachbereich Math., Tech. Univ. Berlin, Germany, pp. 1-9, 1998.

Nimour, S.M.A. et al., "Effect of Spatially Disordered Barriers on the Band Structure of Finite Superlattices," phys. stat. sol. (b) 1998, 209, No. 2, 311-318.

Rommel, S.L. et al., "Room Temperature Operation of Epitaxially Grown SI/Si0.5Ge0.5/Si Resonant Interband Tunneling Diodes," Applied Physics Letters, vol. 73, No. 14, pp. 2191-2193, 1998.

Van Der Wagt, J.P.A. et al., "RTD/HFET Low Standby Power SRAM Gain Cell," Source: Corporate Research Laboratories, Texas Instruments, 1998, 4 pages.

Sun, J.P. et al., "Resonant Tunneling Diodes: Models and Properties," Proceedings of the IEEE, vol. 86, No. 4, Apr. 1998, pp. 641-661.

Mazumder, P. et al., "Digital Circuit Applications of Resonant Tunneling Devices," Proceedings of the IEEE, vol. 86, No. 4, pp. 664-686, Apr. 1998.

News Release from www.eurekalert.org/releases/udel-udcnflb. html,"UD Computer News: Future Looks Bright for Tunnel Diodes, Promising Faster, More Efficient Circuits," Oct. 1, 1998, 4 pages.

Seabaugh A. et al., "Resonant Tunneling Mixed Signal Circuit Technology," Solid-State Electronics 43:1355-1365, 1999.

Wirth, G. et al., "Negative Differential Resistance in Ultrashort Bulk MOSFETs," IECON'99 Conference Proceedings, vol. 1, San Jose, 1999, pp. 29-34.

Mathews, R.H. et al., "A New RTD-FET Logic Family," Proceedings of the IEEE, vol. 87, No. 4, pp. 596-605, 1999.

Van Der Wagt, J.P.A., "Tunneling-Based SRAM," Proceedings of the IEEE, vol. 87, No. 4, pp. 571-595, 1999.

Heij, C.P. et al., "Negative Differential Resistance Due to Single-Electron Switching,"Applied Physics Letters, vol. 74, No. 7, Feb. 15, 1999, 5 pages.

Pacha, C. et al., "Resonant Tunneling Device Logic Circuits," Microelectronics Advanced Research Initiative (MEL-ARI), Jul. 1999, pp. 1-22.

Hong, J. W. et al., "Local charge trapping and detection of trapped charge by scanning capacitance microscope in SiO2/Si system," Appl. Phys. Lett., 75(12), Sep. 20, 1999, pp. 1760-1762.

Haddab, Y. et al., "Quantized current jumps in silicon photoconductors at room temperature," J. Appl. Phys.86(7), Oct. 1, 1999, pp. 3787-3791.

Seabaugh, A., "Promise of Tunnel Diode Integrated Circuits," Tunnel Diode and CMOS/HBT Integration Workshop, Dec. 9, 1999, Naval Research Laboratory, Washington, DC., 13 pages.

Zhang, J., "Traps: Detrapping,"Wiley Encyclopedia of Electrical and Electronics Engineering Online, Article Posting Date: Dec. 27, 1998, John Wiley & Sons, Inc., 4 pages.

Zhang, J., "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 pages.

Zhang, J., "Traps: Measurement Techniques," Wiley Encyclopedia of Electrical and Electronics Engineering Online, Article Posting Date: Dec. 27, 1999, John Wiley & Sons, Inc., 5 pages.

Zhang, J., "Traps,"Wiley Encyclopedia of Electrical and Electronics Engineering Online, Article Posting Date: Dec. 27, 1999, John Wiley & Sons, Inc., 2 pages.

Zhang, J., "Traps: Trapping Kinetics," Wiley Encyclopedia of Electrical and Electronics Engineering Online, Article Posting Date: Dec. 27, 1999, John Wiley & Sons, Inc., 2 pages.

Zhang, J., "Traps: Origin of Traps,"Wiley Encyclopedia of Electrical and Electronics Engineering Online, Article Posting Date: Dec. 27, 1999, John Wiley & Sons, Inc. 4 pages.

Gonzalez, A. et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Karna, Shashi P. et al., "Point defects in Si-SiO2 systems: current understanding," Published in G. Pacchioni et al., (eds.), "Defects in SiO2 and related dielectrics: science and technology," Kluwer Academic Publishers, (2000), 19 pages.

Geppert, Linda, "Quantum transistors: toward nanoelectronics," IEEE Spectrum, Sep. 2000, pp. 46-51.

Seabaugh, A. et al., "Tunnel-Diode IC," Minneapolis, Oct. 2, 2001, 23 pages.

Believed to be published in: Deen, Jamal (editor) et al., excerpt from "CMOS RF modeling, characterization and applications," World Scientific, Apr. 2002, 34 pages.

Scofield, John H. et al., "Reconciliation of different gate-voltage dependencies of l/f noise in n-MOS and p-MOS transistors," IEEE Trans. Electron. Dev. 41(11), 11 pages.

Final Report: Smile Mel-Ari Project n.degree.28741 -Chapter V, pp. 184-194.

Villa, S. et al. "Application of 1/f noise measurements to the characterization of near-interface oxide states in ULSI n-MOSFET's," Dipartimento di Elettronica e Informazione, Politecnico di Milano (Italy), 7 pages.

Nemati, F. et al., "A Novel High Density, Low Voltage SRAM Cell With a Vertical NDR Device," Center for Integrated Systems, Stanford University, CA, (2 pages).

Nemati, F. et al., "A Novel Thyristor-based SRAM Cell (T-RAM) for High-Speed, Low-Voltage, Giga-scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley Berkeley CA, (4 pages).

Oberhuber, R. et al., "Tunnel-Devices with Negative Differential Resistivity Based on Silicon?," Source: Deutsche Forschungsgemeinschaft and Siemens AG, date unknown, 2 pages.

Luryi, S. et al., "Collector-Controlled States in Charge Injection Transistors," SPIE-92 Symposium, pp. 1-12, 1992.

* cited by examiner

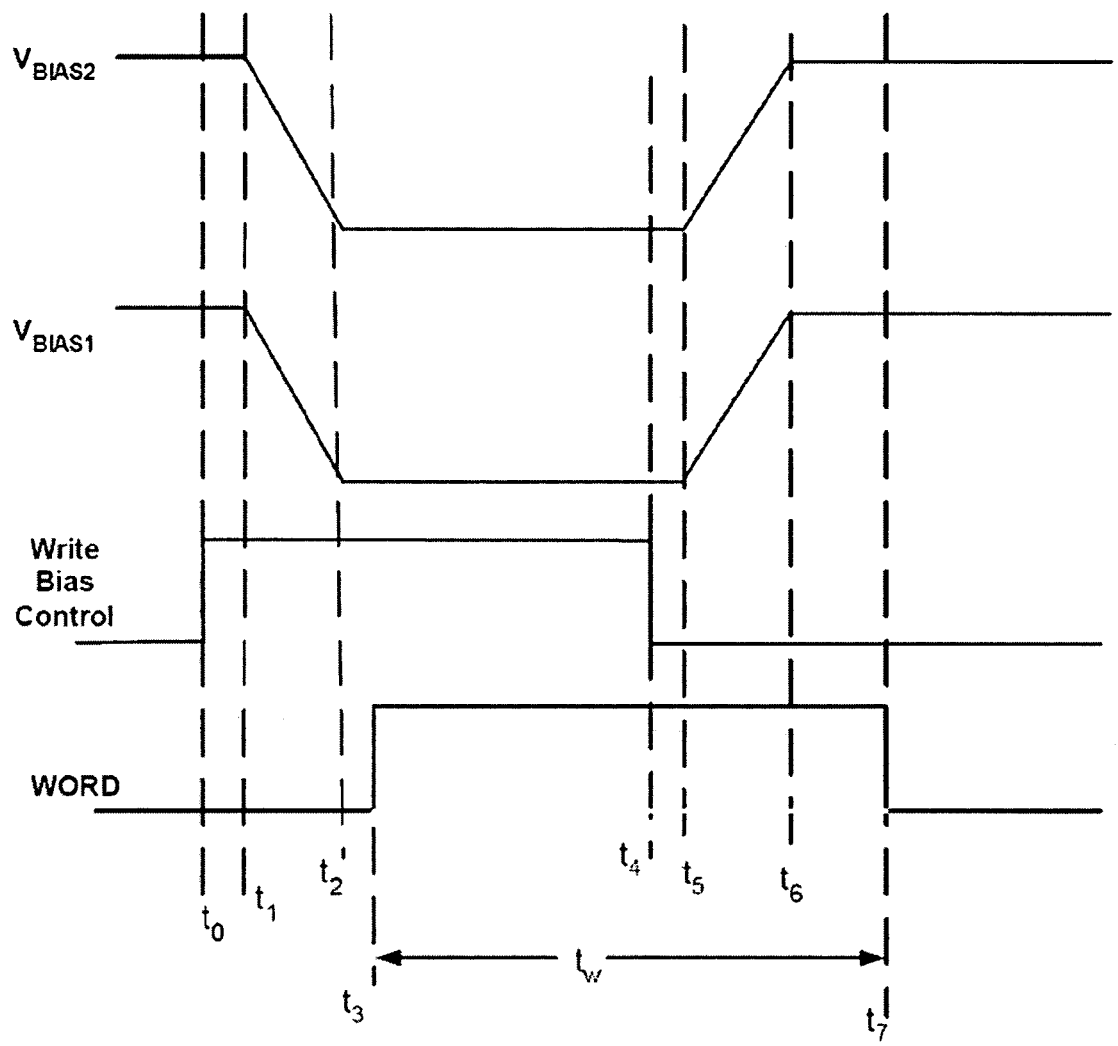

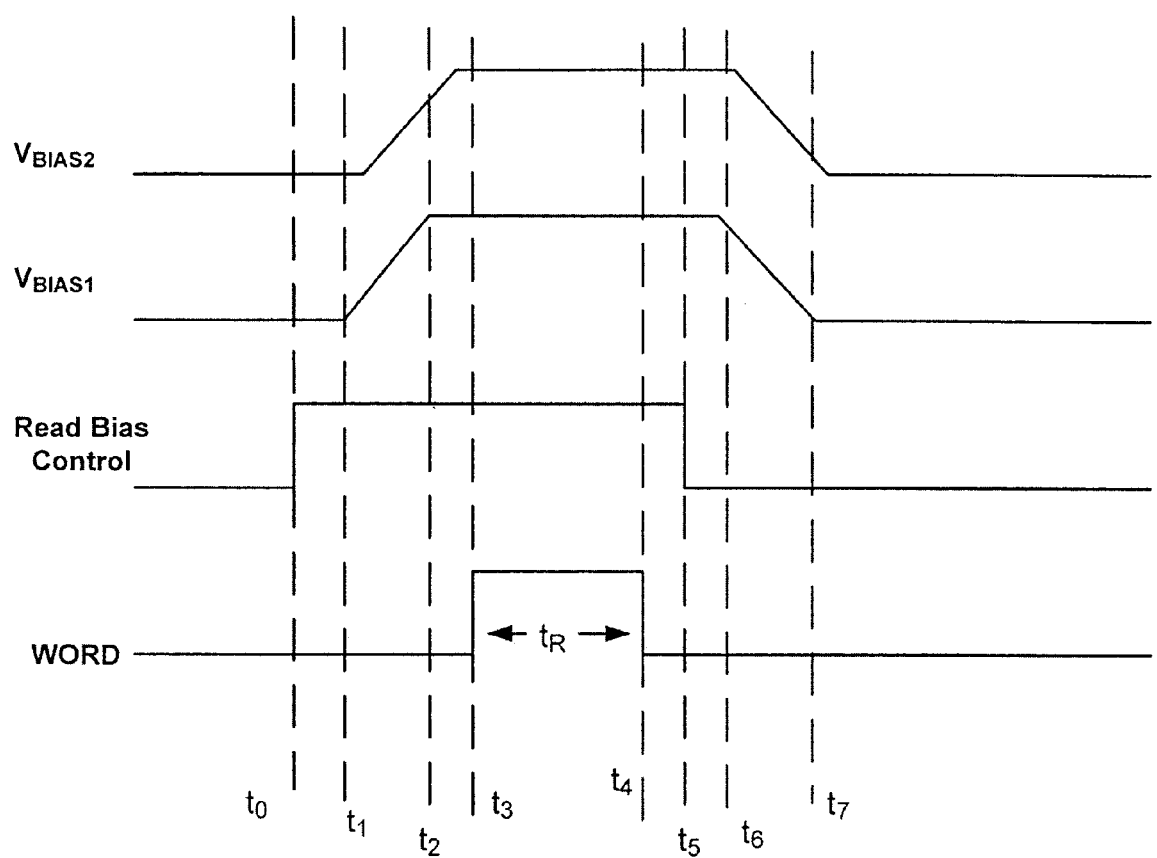

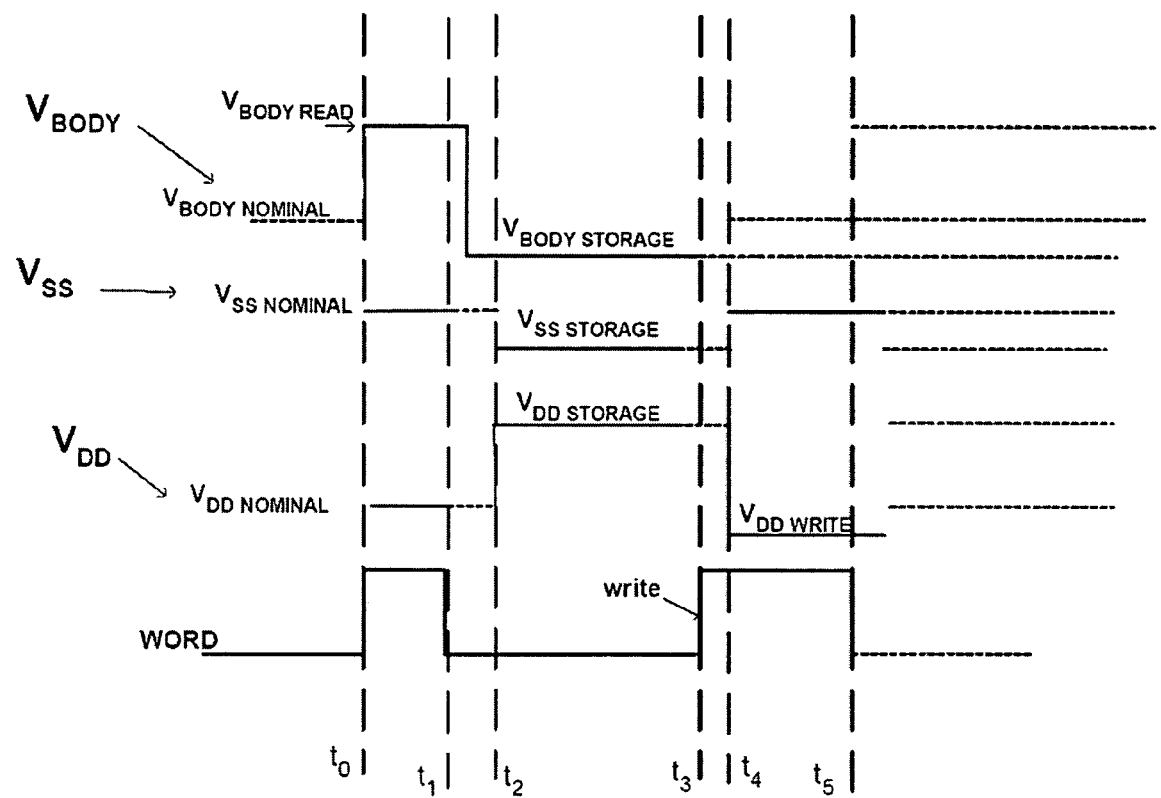

VARIABLE VOLTAGE SUPPLY BIAS AND METHODS FOR NEGATIVE DIFFERENTIAL RESISTANCE (NDR) BASED MEMORY DEVICE

REFERENCE TO RELATED APPLICATIONS

This application is a continuation-in-part of U.S. patent application Ser. No. 11/010,132 entitled "Enhanced Read And Write Methods For Negative Differential Resistance (NDR) Based Memory Device" filed Dec. 9, 2004, now U.S. Pat. No. 7,012,842, which is a continuation of U.S. patent application Ser. No. 10/185,247 entitled "Enhanced Read And Write Methods For Negative Differential Resistance (NDR) Based Memory Device" filed Jun. 28, 2002, now U.S. Pat. No. 6,847,562.

FIELD OF THE INVENTION

This invention generally relates to methods of operating semiconductor memory devices and technology, and in particular to biasing operations for memory devices, and particularly static random access memory (SRAM) devices that utilize negative differential resistance (NDR) elements.

BACKGROUND OF THE INVENTION

A new type of SRAM device using Negative Differential Resistance Field Effect Transistors (NDR FETs) is described in detail in a patent application Ser. No. 10/029,077 filed Dec. 21, 2001 by T.-J. King and assigned to the present assignee, and published on May 9, 2002 as Publication No. 2002/0054502. The NDR FET structure, operation and method of making the same are discussed in detail in patent application Ser. No. 09/603,101 filed Jun. 22, 2000 by King et al., which is also assigned to the present assignee. Such details are also disclosed in a corresponding PCT application PCT/US01/19825 which was published as publication no. WO 01/99153 on Dec. 27, 2001. Methods for reducing soft error rates in such NDR FET based SRAM cells are described in U.S. Pat. No. 6,567,292, entitled "NEGATIVE DIFFERENTIAL RESISTANCE (NDR) ELEMENT AND MEMORY WITH REDUCED SOFT ERROR RATE" by King, and issued on May 20, 2003. The above materials are hereby incorporated by reference.

As is well-known in the art, some of the important benchmarks for memory devices that determine the suitability for a particular application include the quiescent power rating, read speed and write speed. Furthermore, the peak-to-valley ratio (PVR) of the operating and quiescent current for a cell is also a significant factor that limits the feasibility of certain embodiments. For many applications it is believed that a PVR must exceed 10,000 to be practical at commercially desirable densities (i.e., in the MB range and above). Thus, it is apparent that the aforementioned NDR based SRAMs (and other NDR based memories) would also benefit from an increase in operating performance of the NDR elements to meet the aforementioned benchmarks.

SUMMARY OF THE INVENTION

An object of the present invention is to provide operating methods that improve characteristics of a memory device, including particularly those that incorporate static random access memory (SRAM) cells that utilize NDR FET elements.

A first aspect of the invention therefore concerns a method of operating a memory cell that includes a negative differential resistance (NDR) capable element. This generally includes the following steps: applying a bias signal to the NDR-capable element, during a first operation period in which the memory cell is storing a data value, to enable the NDR-capable element to operate with an NDR characteristic (i.e., operation in which current flow through the NDR-capable element decreases with increasing drain-to-source voltage, for a range of drain-to-source voltage values). This NDR characteristic is adjusted to facilitate storing of the data value in the memory cell during a first storage operation. During a second operation (i.e., such as a write operation) the bias signal is adjusted so as to lower the peak current immediately prior to and/or during the second operation.

In a preferred approach, the NDR-capable element is an NDR field effect transistor (FET) and the NDR characteristic is exhibited in a channel region of the NDR FET. In this manner, the bias signal is applied to a gate of the NDR FET and is adjusted so that the peak current is substantially lowered. Further in a preferred approach, the bias signal is adjusted immediately during the second operation period to re-enable the NDR characteristic and facilitate storing of a new data value written to the memory cell.

Another aspect of the invention concerns a method of operating a memory cell that exhibits variable NDR behavior during a write operation. This is achieved by applying a bias signal to the NDR element during a first period in which the memory cell is storing a data value. In this operational state, the bias signal has a first signal characteristic during the first period (for example, a high voltage level) so as to control the NDR element to have a first operating characteristic (for example, to enable an NDR behavior). During a second period, the bias signal is adjusted to have a second signal characteristic so as to control the NDR element to have a second operating characteristic (for example, to lower the peak current and disable the NDR behavior) immediately prior to and/or during a write operation associated with the memory cell.

Accordingly, in a preferred approach, the first signal characteristic is a first signal voltage amplitude level associated with the bias signal, and the second signal characteristic is a second signal voltage amplitude level associated with the bias signal. The first signal voltage amplitude level is greater than the second signal voltage amplitude level so that the first operating characteristic includes an NDR operating region and the second NDR characteristic exhibits lower peak current and may or may not include an NDR operating region.

Further in a preferred embodiment, the data value is erased before the write operation effectuates writing of a subsequent data value to the memory cell.

Finally, a preferred memory cell of this invention uses both a first NDR element (as a pull-up element) and a second NDR element (a pull-down element) connected in series to a storage node and the first NDR element. In such instances, the bias signal is applied to the second NDR element as well as the first NDR element at substantially the same time during the first period and the second period.

Yet another aspect of the invention pertains to operating a memory cell (including NDR variations) to use an indeterminate state during a write operation. This is accomplished by applying a bias signal to an NDR FET (in the memory cell) to cause it to operate with an NDR characteristic while the cell is storing a particular first data value. Later, and immediately preceding a write operation, the first data value stored in the memory cell is effectively "erased" by adjusting the bias signal to disable the NDR characteristic. In other words, the first data value is preferably represented by a first voltage potential or a second voltage potential present in a storage node of the memory cell, and during the erasing step the storage node is set to a third voltage potential. Notably, this third voltage potential is set without regard to a voltage potential associated with a second data value to be written to the memory cell, and is caused by disabling the NDR characteristic of the FET. This then results in an indeterminate state for the storage node that lies somewhere between the first voltage potential and the second potential. The final value is not critical to this aspect of the invention. During the actual write operation, the second data value is written to the memory cell so that the storage node is adjusted from the third voltage potential (either up or down) to one of at least the first voltage potential or the second voltage potential.

In a preferred embodiment, the cell is designed and operated so that the third voltage potential corresponds to a voltage potential that is approximately half-way between the first voltage potential and the second voltage potential. This ensures that (for random data at least), the overall current consumed is reduced.

Further in a preferred approach for this aspect of the invention, the NDR FET is a pull-up element in the memory cell, and the bias signal is also applied to a second NDR FET acting as a pull-down element of the memory cell.

In yet another aspect of the invention, an "erase before write" operation is performed for a memory cell, including an SRAM, by adjusting a bias signal to the pull-down and pull-up elements. This then effectively erases the cell by placing the storage node in an indeterminate state. To do this, the bias signal is set to a first amplitude, and then to a second amplitude that is less than the first amplitude during the erase step. After the new data is written to the cell the bias signal is restored from the second amplitude back to the first amplitude. To control the cell in this fashion a bias control signal is generated, in response to initiation of a write operation, to control signal characteristics of the bias signal, including an amplitude of such signal.

Other aspects of the invention concern operations which enhance characteristics of active elements for a memory cell, including characteristics of read operations performed for an NDR based memory cell.

In a first aspect, an NDR based memory cell operates by applying a bias signal to the NDR-capable element, during a first operation period in which the memory cell is storing a data value, to enable the NDR-capable element to operate with an NDR characteristic. The NDR characteristic is adjusted to facilitate storing of the data value in the memory cell during a first storage operation. During a second operation period the bias signal is adjusted so as to enhance the NDR characteristic and a current drive characteristic of the NDR-capable element immediately prior to and/or during a second operation associated with the memory cell.

In this fashion, additional current can be provided to improve a read speed for the memory cell. In a preferred approach, the NDR-capable element includes an NDR field effect transistor (NDR FET). During the read operation, the bias signal is adjusted to have an amplitude that is larger than that used during quiescent storage mode. This allows an NDR memory cell to be viable in a multi-megabit memory array, since a ratio of a quiescent current produced by the memory cell to a read operation current (PVR) produced by the memory cell can exceed 10,000. Other techniques for accelerating a read speed, such as precharging a BIT line coupled to the memory cell, can also be employed.

Another aspect of the invention concerns adjusting the NDR behavior of a memory cell during a read operation, analogous to that explained above for a write operation—except that for a read operation the NDR behavior is enhanced rather than impaired.

In another embodiment, an SRAM cell (e.g., in an SRAM array) that includes a latching circuit can be operated by strengthening the latching circuit to increase read speed and/or weakening the latching circuit to increase write speed. In one embodiment, the latching circuit is connected between an upper supply voltage and a lower supply voltage and includes at least one of a lower NDR FET connected between the lower supply voltage and a storage node and an upper NDR FET connected between the upper supply voltage and the storage node. During a read operation, the upper supply voltage can be slightly increased (and/or the lower supply voltage can be slightly decreased) to enhance the NDR characteristic(s) of the lower (and/or upper) NDR FET. As a result, the NDR valley current(s) of the lower (and/or upper) NDR FET(s) is reduced, thereby strengthening the latching effect produced by the latching circuit. Similarly, during a write operation, the upper supply voltage can be decreased (and/or the lower supply voltage can be increased) to attenuate the NDR characteristic(s) of the lower (and/or upper) NDR FET(s). This attenuation results in an increased NDR valley current(s) for the lower (and/or upper) NDR FET(s), which in turn weakens the latching effect produced by the latching circuit.

In another embodiment, an increased upper supply voltage can be provided to the latching circuit while a data value is being stored in the latching circuit. As noted above, the increased upper supply voltage reduces the NDR valley current of the lower (and upper) NDR FET. If a logic HIGH voltage is stored in the latching circuit, the lower NDR FET is operating in the NDR mode, and the current flow through the latching circuit is determined by the NDR valley current of the lower NDR FET (if present). If a logic LOW voltage is stored in the latching circuit, the current flow through the latching circuit is determined by the NDR valley current of the upper NDR FET (if present). Therefore, by increasing the upper supply voltage to decrease these NDR valley currents, the static power consumption of the SRAM cell can be reduced.

These and other aspects of the invention are now described in detail with reference to the figures provided herein.

BRIEF DESCRIPTION OF THE DRAWINGS

FIG. 3A is a timing diagram illustrating the general sequence and relationship of signals used in memory embodiments that incorporate a preferred writing method of the present invention.

FIG. 3B is a timing diagram illustrating the general sequence and relationship of signals used in memory embodiments that incorporate a preferred reading method of the present invention.

FIG. 3C is a timing diagram illustrating the general sequence and relationship of signals used in memory embodiments that incorporate a preferred cell biasing method of the present invention;

DETAILED DESCRIPTION OF THE INVENTION

Various embodiments of the invention are now described.

Figure 1:
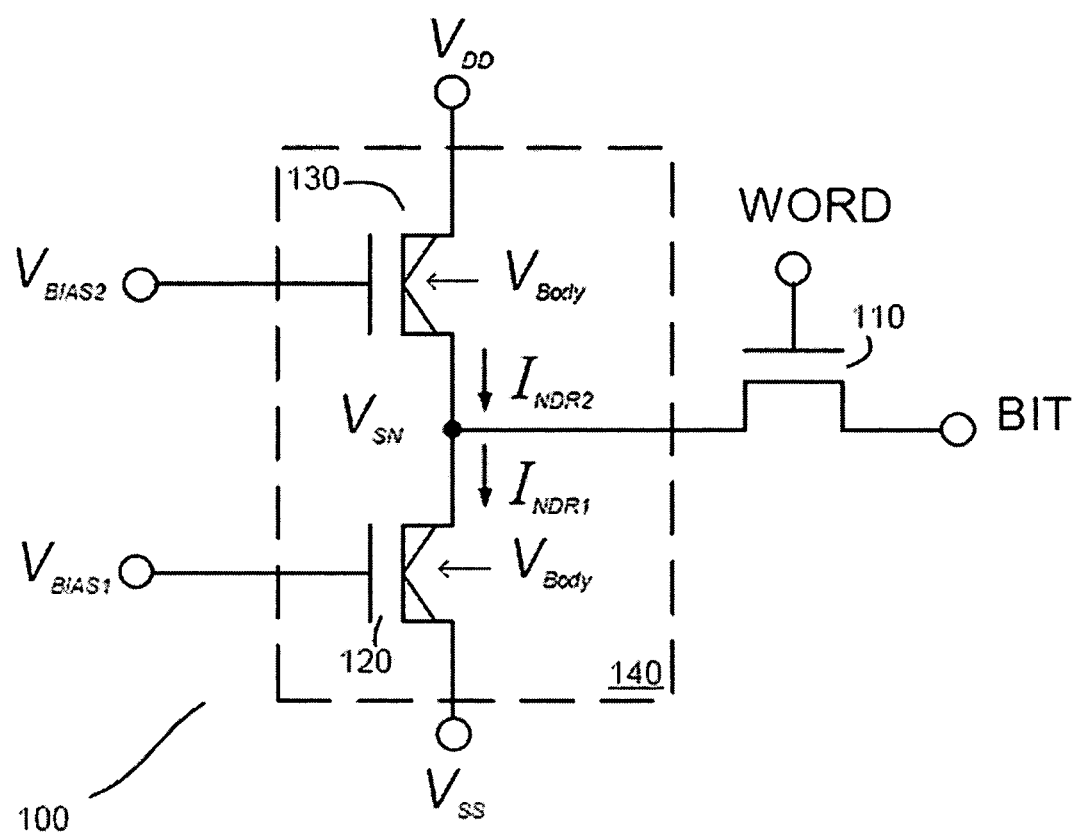
FIG. 1 is a circuit diagram of a static random access memory (SRAM) cell consisting of the combination of two NDR-FET elements which form a bistable latch and one n-channel enhancement-mode insulated-gate field effect transistor (IGFET) access element.

As noted earlier, FIG. 1 is a circuit diagram of a preferred embodiment of a static memory (SRAM) cell 100 consisting of two NDR elements 120 and 130 that form a bistable latch 140 and one enhancement-mode IGFET access element 110. While a three (3) element implementation is shown in FIG. 1, the invention is by no means limited to such embodiments, as other designs employing NDR elements can also benefit from the present teachings. Within cell 100 NDR element 120 can be considered a pull-down element, or a driver element, while NDR element 130 can be considered as a pull-up element, or a load element as those terms are understood in this field of art.

Figure 2:
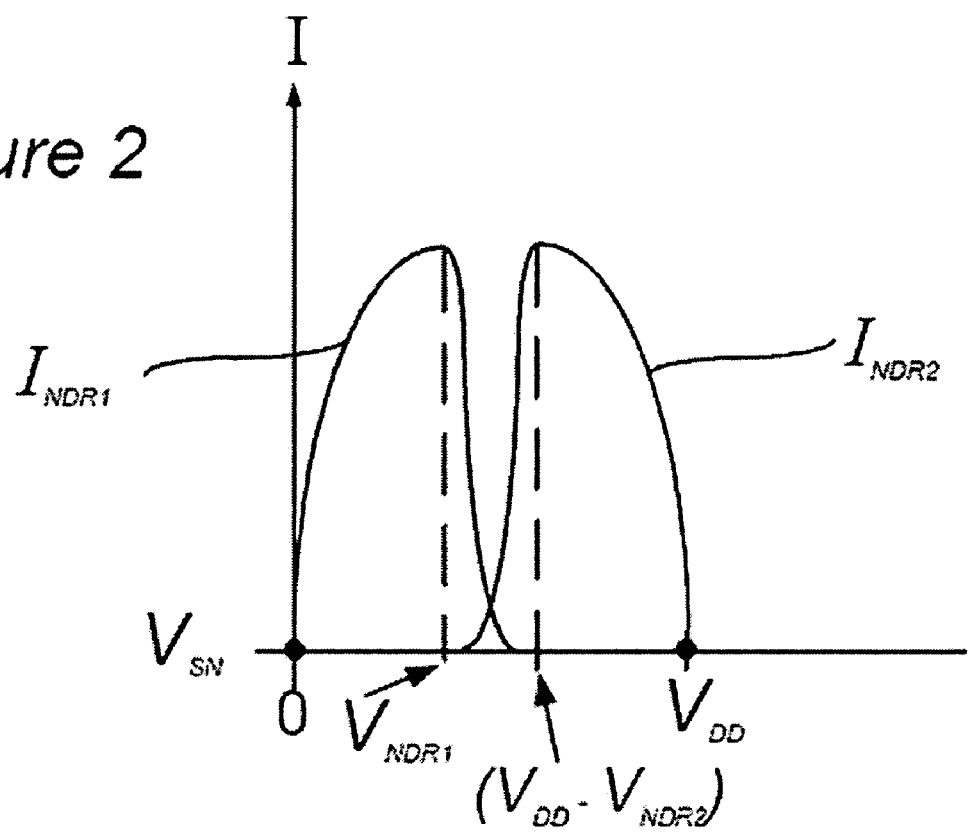
FIG. 2 is a plot of the current-vs.-voltage characteristic of the bistable latch formed by the combination of two NDR-FETs as shown in FIG. 1.

FIG. 2 is a current-vs.-voltage plot illustrating the general operational characteristics of the static memory cell 100 of FIG. 1, including in a storage mode of operation. Again, it will be understood by those skilled in the art that this Figure is merely intended to give an overall understanding of the general I-V characteristics of an NDR element, and that the actual performance of any particular implementation of the invention may vary (i.e., the particular curve profiles may be different) from that shown in FIG. 2 without straying from the scope of the present invention.

As shown in FIG. 2, a current $I_{NDR1}$ flowing through NDR element 120 initially increases as storage node voltage $V_{SN}$ increases (for a given control terminal (gate) voltage). However, when storage node voltage $V_{SN}$ reaches an NDR threshold voltage $V_{NDR1}$, the NDR characteristic of NDR element 120 is manifested, and current $I_{NDR1}$ rapidly decreases with increasing $V_{SN}$, to an NDR valley current at $V_{SN}=V_{DD}$ that is close to zero. Because storage node voltage $V_{SN}$ acts as the source voltage for NDR element 130 rather than the drain voltage (as it does for NDR element 120), the current $I_{NDR2}$ flowing through NDR element 130 exhibits a behavior that is essentially opposite to that of current $I_{NDR1}$ flowing through NDR element 120. Thus, as storage node voltage $V_{SN}$ increases from zero, the NDR characteristic of NDR element 130 is manifested as a minimal current $I_{NDR2}$ (because the low storage node voltage VSN results in a large voltage across the conduction terminals (i.e., the drain and source) of NDR element 130). However, as storage node voltage $V_{SN}$ approaches a voltage equal to upper supply voltage $V_{DD}$ minus the NDR threshold voltage of NDR element 130 (i.e., a voltage $V_{DD}-V_{NDR2}$), current $I_{NDR2}$ rapidly increases and peaks when storage node voltage $V_{SN}$ is equal to $V_{DD}-V_{NDR2}$. Subsequently, NDR element 130 is no longer operating in NDR mode as $V_{SN}$ increases, and current $I_{NDR2}$ decreases as storage node voltage $V_{SN}$ increases (i.e., as the drain-to-source voltage across NDR element 130 decreases).

As can be seen from the graph of FIG. 2, the latching circuit formed by NDR elements 120 and 130 is in a stable operating condition when storage node voltage $V_{SN}$ is equal to zero volts (i.e., lower supply voltage $V_{SS}$), and when storage node voltage $V_{SN}$ is equal to upper supply voltage $V_{DD}$. If the value of storage node voltage $V_{SN}$ increases slightly above that of the low voltage (i.e., 0 volts) stable operating point, current $I_{NDR1}$ flowing in NDR element 120 quickly becomes higher than the current $I_{NDR2}$ flowing in NDR element 130, thereby causing the value of storage node voltage $V_{SN}$ to be decreased toward 0 V (ground potential), to restore it to that of the stable operating point. Thus first NDR element 120 serves as a "pull-down" device. If the value of storage node voltage $V_{SN}$ falls slightly below that of the high voltage (i.e., $V_{DD}$) stable operating point, the current $I_{NDR2}$ flowing in NDR element 130 quickly becomes higher than the current $I_{NDR1}$ flowing in NDR element 120, thereby causing the value of storage node voltage $V_{SN}$ to be increased toward $V_{DD}$ to restore it to that of the stable operating point. Thus second NDR element 130 serves as a "pull-up" device.

NDR elements 120, 130 of the present invention are preferably an NDR FET of the type referred to above in the aforementioned King and King et al. applications. The details of the same are provided for example in the aforementioned applications, and such documents are incorporated by reference herein primarily for the purpose of providing non-essential background information on representative types of environments in which the present inventions can be practiced. Other types of silicon based NDR FETs are clearly suitable and encompassed within the present teachings, particularly to the extent their PVR performance can be enhanced through intelligent biasing as noted below.

Enhanced Write Operation

A preferred method for writing to an NDR based SRAM cell is now described. It will be understood by those skilled in the art that the present invention could be used with other memory devices (aside from SRAMs of the type shown in the aforementioned Ser. No. 10/029,077), including for example those that utilize active elements having NDR characteristics.

In brief, to improve write access time, the NDR element (a metal oxide semiconductor transistor—referred to as MOST herein, which is a type of field effect transistor (FET)) gate bias voltage(s) are pulsed low to lower the peak current of both NDR MOST transistors just prior to programming (word line pulsed high). The gate bias voltage(s) would return to the "normal" high-voltage state just after the word line voltage reaches the high voltage state.

Viewed from an operational perspective, memory device 100 may be effectively considered erased and set to a third logical state that is intermediate or between two extreme possible states (i.e., a high voltage potential or a low voltage potential present on the storage node). This state can also be characterized as indeterminate (in the sense that the ultimate ending state is uncertain or unpredictable depending on the amount of time reserved for such operation), but which is nonetheless "easier" (and faster) to write to, instead of having it start off as a logical 0 state or logical 1 state. In a preferred approach, storage node voltage $V_{SN}$ is set to a voltage potential that is about halfway between $V_{DD}$ and Ground ($V_{SS}$) as seen in FIG. 1. This again, can be thought of as a form of directly pre-charging the storage node or the memory cell in anticipation of the data value to be written. This procedure, therefore, may have advantages in other SRAM memory environments aside from NDR based cells, as a type of erase before (or as part of) a write operation.

This operation is described in detail with reference to FIG. 3A. Prior to time $t_0$ the memory cell is in a quiescent mode of operation, in which it is operating to store a particular data value. At this time a write bias disable/control signal is generated, causing both Vbias1 and Vbias2 inputs to go from a normal NDR-capable voltage state to a lower voltage state beginning at time $t_1$, and reaching a final low state at time $t_2$. At this point and in this form, the bias signals are adjusted to enhance a write operation for the cell, and can be considered as write-enhancement signals. Because NDR FETS 120 and 130 (FIG. 1) use a somewhat higher bias signal, it is possible to reduce Vbias1 and Vbias2 only by an amount needed (i.e., only partway to $V_{SS}$) to lower the peak current of the NDR FETs (and thus disable the NDR behavior of such FETs as well). Accordingly, this operation can be accomplished in a very short period of time. In a preferred embodiment NDR FETs 120 and 130 are connected to a common bias signal (i.e., Vbias1 and Vbias2 are the same).

At time $t_3$, a write signal is applied to transfer FET 110, and a new data value is written (programmed) into memory cell 100 through the BIT line in any conventional fashion during a write mode or write operation for the cell. Since both NDR FETs are essentially disabled, they do not materially affect the write speed of a particular data value (0 or 1) into node $V_{SN}$ during a write time $t_W$ (which lasts until $t_7$). At time $t_4$, the write bias control signal goes low, and thus at time $t_5$ the respective bias signals to the two NDR FETs begin to be restored to their original state, so that at time $t_6$ the two NDR FETs again contribute to the maintenance (latching) of the data value as written into the memory device (i.e., during a later storage mode) through their respective NDR characteristics.

It will be understood by those skilled in the art that the timing as shown in FIG. 3A is merely exemplary, and that other variations could be beneficially employed and still be encompassed by the present invention. For example, when two input bias signals are used, they might be separately disabled at different times; similarly, they may be re-enabled at different times. Furthermore, there may be some overlap permitted in some cases between when the write signal is activated ($t_3$) and the period in which the NDR bias signals are reaching their lower voltage state (from $t_1$, to $t_2$). While the write Bias control is shown as a single signal, it will be understood that in fact its function can be achieved by several independent signals in accordance with standard design techniques.

Moreover, the diagram is not intended to be to scale, so the initiation, slew rate, amplitude and duration of the signals shown can be varied without departing from the spirit of the present invention. The various circuits required to implement the timing of FIG. 3A, including the generation of the write bias control (disable) signal based on initiation of a write operation, and the adjustment of Vbias1 and Vbias2 during a write operation or write mode, can be constructed by a variety of means through ordinary design skill. The particulars of such circuit are not material to the present teachings, so the invention is by no means limited to any particular implementation of the same. In addition to controlling the signal amplitude level, other methods for controlling the respective bias signals to the NDR FETs will be apparent to skilled artisans to achieve substantially the same result.

Thus, from this description it can be seen that both NDR FETs originally in a storage operating mode are essentially weakened (or completely disabled) just prior to the programming operation (or write mode) to reduce/eliminate any contribution to the write operation. The NDR FETs are turned on again before the write operation is finished so that they then "latch" the stored data at node SN by their NDR behavior as noted in the aforementioned applications Ser. No. 10/029,077. This process has the additional benefit that overall power consumption is also reduced for write operations as compared to prior techniques.

Looked at from another perspective, the present invention can be thought of as temporarily attenuating or disabling an otherwise advantageous NDR behavior during certain operational time periods for a memory cell, such as during selected portions of a write process. It is conceivable that it may be also desirable to disable such NDR behavior during other times (power up, reset, test) for the memory cell, or in other circuits during their normal operations; such are clearly contemplated by the present teachings. Finally, other general memory cells/devices (not including NDR elements) may benefit from selective enabling/disabling of pull-up and pull-down elements contained therein to enhance a write operation.

It will be understood, of course, that, at least for a write process, it may not be necessary to completely disable such devices prior to such operation, and the overall write process may be improved significantly even by biasing techniques that merely impair or reduce the participation of the NDR FETs during selected portions (or all) of a write operation.

This write enhancement of the present invention is extremely useful because typically with reference to FIG. 1, if storage node voltage $V_{SN}$ is at a low value, and a write operation is to be performed for a high value, then cell 100 does not get set to a stable operating point until an NDR behavior of NDR element 120 shuts it off. At such time, node $V_{SN}$ is thus completely controlled by pull-up element 130 which sets it to a high potential (i.e., $V_{DD}$ or thereabouts). A similar situation arises for the opposite case where a write operation is to be performed for a low value when the storage node voltage $V_{SN}$ is at a high value. Accordingly, a write-speed for a typical NDR SRAM cell 100 is controlled by NDR switching characteristics of NDR FETs 120 and 130. By disabling an NDR characteristic of the NDR FETs in advance of a write operation, the switching time to stabilize a new value written to cell 100 is reduced because the NDR elements are at least partly shut off while the data is being written.

It should be noted that in some instances this type of write "enhancement" will not be necessary or desirable. For example, in cases where the overall write time (as shown in FIG. 3A) exceeds a period required for a conventional write operation, it is preferable not to use the aforementioned technique. This may be possible when the operating characteristics of the NDR elements (their settling times) are sufficiently fast to pull the storage node up or down in a time quicker than that possible using the enhanced technique noted above. This limiting factor, in turn will determine the extent to which the NDR FET element bias voltages needs to be attenuated for any particular application.

Read Operation Enhancement

In a similar fashion, a further related aspect of the invention pertains to a preferred method for reading an NDR based SRAM cell, such as the type discussed above. Again, it will be understood by those skilled in the art that the present invention could be used with other memory devices (aside from SRAM), including those that utilize active elements having NDR characteristics.

In summary, to improve read access time during a read mode, the NDR FET gate bias voltage(s) are pulsed to a higher-than-"normal"0 voltage just before the word line is pulsed high. The resulting higher peak current charges the bit line faster, for faster read access time. After the read operation is completed, the gate bias voltages are then returned to the "normal" high-voltage state just after the word line returns to the low-voltage state to ensure proper maintenance of the data value during a subsequent storage mode.

Viewed from another perspective, it can be seen that in contrast to the write enhancement operation described earlier, the NDR FETs in the read enhancement method of the present invention have their peak current (and to some extent their NDR behavior) effectively "enhanced" rather then reduced (or disabled) during a read mode. In this manner, the overall peak-to-valley ratio (PVR) of a memory cell using NDR devices can be enhanced by such technique. In other words, the peak current of the memory cell is increased without a corresponding increase in overall static leakage current, because the "boost" to the current is performed only during portions (or all of) a read operation. Furthermore, the NDR FETs of the present invention are characterized by the fact that a peak current increases with increasing applied gate voltage (i.e., in a non-NDR operating region) but the valley current does not increase as quickly with increasing applied gate voltage. Thus, the PVR improves generally as a function of a gate drive applied to NDR FETs 120 and 130, and this aspect can be exploited in SRAM embodiments through dynamically varying the gate bias signals as explained herein. By this same principle, therefore, the PVR for any particular embodiment, such as for a low power embodiment, can also be improved by reducing gate bias signals to NDR FETs 120, 130 to reduce a valley current, just as they were raised during a sense or read mode to increase a peak current. Furthermore, unlike many other prior art devices, by using NDR FETs in an SRAM cell, the PVR is substantially more constant over temperature, and this is yet another benefit of using such technology.

The preferred reading method is described in detail with reference to FIG. 3B. Prior to a read mode, the memory cell is in a quiescent storage mode as noted earlier. Just before a read operation commences, namely, at time $t_0$, a read bias control (in this case, a read enhancement) signal is generated, causing both Vbias1 and Vbias2 inputs to go from a normal NDR-capable voltage state to a higher voltage state starting at time $t_1$ and reaching a final high state at time $t_2$. At this point and in this form, the bias signals are adjusted to enhance a read operation for the cell, and can be considered as read-enhancement signals. Again, in a preferred embodiment, as noted earlier, both NDR FETs are connected to a common bias line and bias signal.

Because NDR FETS provide a drive current proportional to their gate voltage, it is possible to boost Vbias1 and Vbias2 by a controlled amount that also increases the NDR behavior of such FETs. Accordingly, this read operation can be accomplished in a very short period of time. At time $t_3$, a read signal is applied to transfer FET 140, and a data value stored in memory cell 100 is read through the bit line.

Note that to improve operational speed for higher speed applications, the bit line can be precharged to a value midway a logical 0 and logical 1 state (typically, $V_{DD}/2$) so that it is either pulled high or low more quickly than if it were starting from a fixed potential that is high or low. In addition, a reference cell (not shown) can be used to allow differential sensing against a sensed cell in a manner akin to that of conventional memory cells and differential sense amplifiers. Other techniques for increasing read time performance will be apparent to those skilled in the art.

Since both NDR FETs are essentially enhanced during parts or all of a read mode or read operation, they help to provide an additional drive current during the reading of a particular data value (0 or 1) in node $V_{SN}$ during a read time $t_R$ (which lasts until $t_4$). At time $t_5$, the read bias control (NDR enhancement) signal goes low again, so that the two NDR FET bias signals are returned to their normal operating value beginning at time $t_6$ and finishing at time $t_7$. Thereafter they again contribute to the maintenance (latching) of the data value as stored into the memory device through their NDR characteristics.

Because there is no adverse effect from enhancing the NDR behavior during the read process, it is not necessary to return the NDR FETs to their normal operating bias prior to completion of the read operation. Nonetheless, this could be done if desired by appropriate adjustment of the bias control signal.

One consequence of using two NDR FETs is that the overall read (or sensing) speed of cell 100 is not limited or tied to an NDR switching speed of an NDR element (i.e., between an NDR region and a non-NDR region). This is advantageous for scaling purposes as well.

As with FIG. 3A, it will be understood by those skilled in the art that the timing as shown in FIG. 3B is merely exemplary, and that other variations could be beneficially employed with the present invention. For example, the two input bias signals Vbias1 and Vbias2 might be separately enhanced at different times; similarly, they may be returned to normal values at different times, and even, as alluded to before, during the time the read signal is still high. Furthermore, there may be some overlap permitted in some cases between when the read signal is activated ($t_3$) and the period in which the NDR bias signals are reaching their higher voltage state (from $t_1$ to $t_2$), or conversely when the read signal is deactivated ($t_4$) and the period in which the NDR bias signals are returning to their normal voltage state (from $t_6$ to $t_7$). Finally, as noted earlier, while the read bias control signal is shown as a single signal, it will be understood that in fact its function can be achieved by several independent signals in accordance with standard design techniques.

Moreover, the diagram of FIG. 3B is not intended to be to scale, so the initiation, slew rate, amplitude and duration of the signals shown can be varied without departing from the spirit of the present invention. The various circuits required to implement the timing of FIG. 3B, including the generation of the bias enhancement signal in response to an initiation of a read operation, and the boosting of Vbias1 and Vbias2 can be constructed by a variety of means through ordinary design skill. The particulars of such circuit are not material to the present teachings, so the invention is by no means limited to any particular implementation of the same.

Looked at from another perspective, this facet of the present invention can be thought of as temporarily enhancing an NDR behavior during certain operational time periods for a memory cell, such as during a read process. It is conceivable that it may be also desirable to boost such NDR behavior during other times (power up, reset, test) for the memory cell, or in other circuits during their normal operations; such are clearly contemplated by the present teachings. Finally, as noted earlier for the write enhancement method of the present invention, other general memory cells/devices (not including NDR elements) may benefit from selective enabling/disabling of pull-up and pull-down elements contained therein during read operations.

Thus, both a write operation and a read operation can be controlled and enhanced by suitable scaling/adjustment of the bias signals provided to the NDR FETs of an NDR SRAM cells. The bias signals thus operated effectuate a type of a read control signal and write control signal for such types of memory devices.

Finally it is apparent, of course, that memory devices operating in accordance herein may utilize one or both of the read/write enhancements disclosed depending on the intended application, manufacturing limitations and required performance characteristics.

Dynamic Supply Voltage for Enhanced Cell Operation

Figure 4:
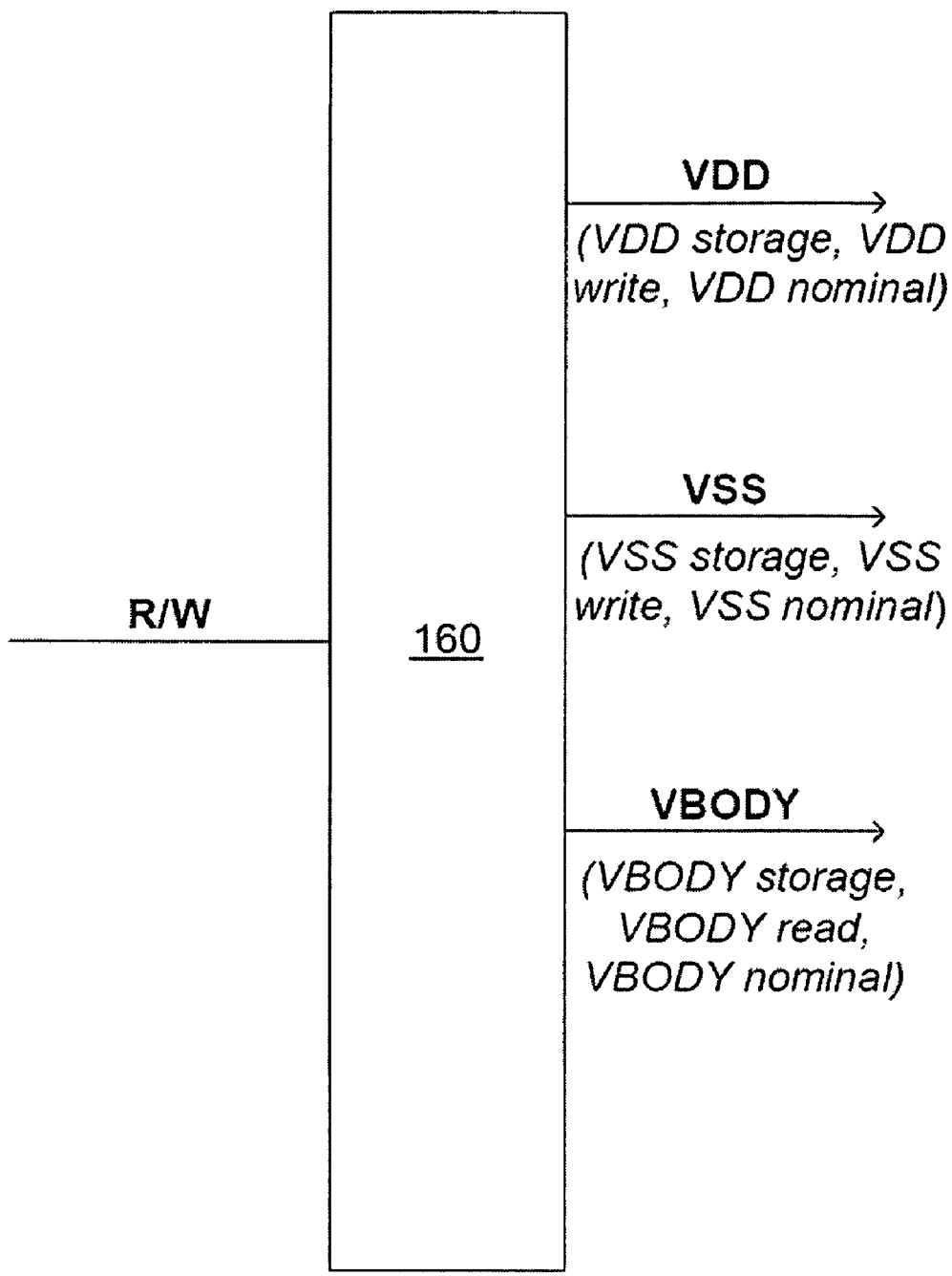
FIG. 4 is a block diagram depiction of a cell supply voltage control circuit for generating the various modified cell operating supply voltage biases.

A related aspect of the invention is illustrated in FIGS. 4 and 3C, which pertains to another preferred method for biasing an NDR based cell, such as the SRAM cell discussed above. Again, it will be understood by those skilled in the art that the present invention could be used with other memory devices (aside from SRAM), including those that utilize active elements having NDR characteristics (such as thyristors) and even memory cells which do not use NDR elements.

When a logical "0" is stored in SRAM cell 100, the quiescent current flow through the latch formed by NDR FETs 130 and 120 is determined largely by the current flow through NDR FET 130. Specifically, when storage node voltage $V_{SN}$ is equal to a logic "0" voltage, the NDR characteristic of NDR FET 130 (i.e., the sharp decrease in current flow through NDR FET 130 once the source-drain voltage across NDR FET 130 exceeds the NDR threshold voltage for the device) is manifested and the current flow through the latch is determined by the NDR valley current of NDR FET 130.

Similarly, when a logical "1" is stored in SRAM cell 100, the quiescent current flow through the latch is determined largely by the current flow through NDR FET 120. Specifically, when storage node voltage $V_{SN}$ is equal to a logical "1" voltage, the NDR characteristic of NDR FET 120 is manifested, and the curent flow through the latch is determined by the NDR valley current of NDR FET 120. Thus, during normal storage operation (when SRAM cell 100 varies between storing logical "0"s and "1"s), the overall static power dissipation of SRAM cell 100 is based on the NDR valley currents of NDR FETs 120 and 130.

In one embodiment, the NDR characteristics of NDR FETs 120 and/or 130 can be tailored so that they are at least partly functions of the applied drain-to-source voltages seen by those devices. By increasing the drain-to-source voltage supplied to a FET, the number of charge carriers available for current conduction is reduced. Within an NDR FET, an increase in drain voltage (for given gate and source voltages) therefore translates into a reduction in NDR valley current. (Decreasing the drain voltage has the opposite effect). A reference to Bhavnagarwala et al., U.S. Pat. No. 6,529,400, incorporated by reference herein, explains in detail the benefits of altering positive ($V_{DD}$) and negative ($V_{SS}$) power supplies to an SRAM cell during read operations to maximize drive current and read noise margin. Notably, however, the reference is limited to a standard p-channel type pull-up element, and thus the resulting cell is larger and more difficult to implement from a process perspective than SRAM cell 100 described herein.

Therefore, in one embodiment, to reduce static power consumption during a storage mode of operation, the upper supply voltage ($V_{DD}$) supplied to SRAM cell 100 (and hence, the drain voltage supplied to NDR FET 130) can be raised from a nominal upper supply voltage $V_{DD\ NOMINAL}$ to an elevated upper supply voltage $V_{DD\ STORAGE}$ (as depicted in the exemplary timing diagram of FIG. 3c) by operation of a supply voltage control circuit 160 (as depicted in the exemplary block diagram of FIG. 4). The increased drain voltage for NDR FET 130 enhances the NDR behavior of NDR FET 130, thereby reducing the NDR valley current of NDR FET 130 when storage voltage $V_{SN}$ is at a logical "0". Similarly, because the elevated upper supply voltage $V_{DD\ STORAGE}$ also increases the value of a logical "1" stored by SRAM cell 100, elevated upper supply voltage $V_{DD\ STORAGE}$ reduces the NDR valley current of NDR FET 120 when storage voltage $V_{SN}$ is at a logical "1". In this manner, elevated upper supply voltage $V_{DD\ STORAGE}$ reduces the static power consumption of SRAM cell 100. This NDR valley current reduction in response to increased upper supply voltage $V_{DD}$ can be seen by reference to FIG. 2 of U.S. Pat. No. 6,596,617. As the drain-to-source voltage $V_{DS}$ increases, current $I_{DS}$ decreases. This counterintuitive result is a direct consequence of the unique characteristics of the NDR FET. Other compatible silicon based devices that include a similar behavior could be exploited in the same fashion.

As seen in the exemplary timing diagram of FIG. 3C, when a read or write operation (R/W) is initiated, the cell supply bias voltages can be returned from $V_{DD\ STORAGE}$ to the "normal" voltage state $V_{DD\ NOMINAL}$. Note that in some instances, it may be desirable to reduce upper supply voltage $V_{DD}$ below the nominal upper supply voltage $V_{DD\ NOMINAL}$ during a write operation, as described in greater detail below. Note further that in other instances, it may be desirable to maintain upper supply voltage $V_{DD}$ at the elevated upper supply voltage elevated upper supply voltage $V_{DD\ STORAGE}$ during read operations, as described in greater detail below.

An exemplary supply voltage control methodology is described in detail with reference to FIG. 3C. During read/write operation at a time $t_0$, the memory cell supply voltage bias (i.e., the difference between the upper supply voltage $V_{DD}$ and the lower supply voltage $V_{SS}$ the voltage potential supplied across the latch formed by NDR FETs 120 and 130 (upper supply voltage $V_{DD}$ minus lower supply voltage $V_{SS}$)) is set to a nominal voltage $V_{DD\ NOMINAL}$ as noted earlier. After the read/write operation finishes, namely, at a time $t_1$, the upper supply voltage is changed from normal voltage state $V_{DD\ NOMINAL}$ to a higher voltage state $V_{DD\ STORAGE}$ at a later time $t_2$, where $V_{DD\ STORAGE} = V_{DD\ NOMINAL} + \Delta_1 V$, where $\Delta_1 V$ is a positive voltage increment. In this manner, the supply voltage bias for SRAM cell 100 is increased during its data storage mode of operation.

The elevated upper supply voltage ($V_{DD\ STORAGE}$) may be supplied at time $t_2$ by a supply voltage control circuit 160 (FIG. 4) which can be the same or a suitably modified versions of that shown in FIG. 3 of the aforementioned U.S. Pat. No. 6,529,400, which responds to a Read/Write initiation (R/W) signal, such as a transition in the WORD line. In some instances, separate READ and WRITE signals may be generated and used by supply voltage control circuit 160. At this point, elevated upper supply voltage $V_{DD\ STORAGE}$ can be considered a storage enhancement signal for reducing the overall current consumption by the cell during a quiescent storage state. During a later read or write operation, the R/W initiation signal goes active again at $t_3$, and the upper supply voltage can be returned to the nominal upper supply voltage $V_{DD\ NOMINAL}$, or some value below this, at time $t_4$. The details of supply voltage control circuit 160 can be implemented in any variety of ways in accordance with known techniques, including the particular embodiments depicted in the prior art.

Note that this upper supply voltage manipulation can be used alone or in conjunction with the aforementioned read/write enhancement signals. Furthermore, one or more of the NDR gate bias voltages Vbias1 and Vbias2 may be reduced in certain embodiments to further reduce current consumption during a storage operation. Thus, in one embodiment, these gate bias voltages may also be generated by circuit 160 in FIG. 4 using conventional techniques, to result in the values and timings shown in FIG. 3A and 3B in response to the Read Bias Control and Write Bias Control signals shown therein.

The current of a conventional FET, of course, is directly related to the gate-to-source voltage $V_{GS}$ ("gate bias"), and a reduction in a gate bias can, in some instances, also attenuate or weaken an NDR effect. However, a benefit provided by the supply voltage biasing technique described above is that by increasing the upper supply voltage ($V_{DD}$) during the storage mode operation for SRAM cell 100, the NDR-attenuating effects of gate bias reductions can be mitigated or even eliminated. An additional benefit of increasing upper supply voltage $V_{DD}$ during the storage mode of operation for SRAM cell 100 is that the overall static noise margin of SRAM cell 100 can be increased.

As alluded to earlier, in still other embodiments it may be desirable to reduce upper supply voltage $V_{DD}$ to some value $V_{DD\ WRITE}$ just before or in response to a write operation (e.g., at time $t_3$ as shown in FIG. 3C), such that $V_{DD\ WRITE}$ at $t_4 = V_{DD\ NOMINAL} - \Delta_2 V$, where $\Delta_2 V$ is a positive voltage increment. This reduction in upper supply voltage $V_{DD}$ has the effect of reducing the NDR characteristics exhibited by NDR FETs 120 and 130, thereby increasing the NDR valley currents of NDR FETs 120 and 130. Due to these increased NDR valley currents, SRAM cell 100 can be more easily written to, because more current from NDR FET 130 is available when raising storage node voltage $V_{SN}$ above zero (when writing a logical "1"), and more current from NDR FET 120 is available when lowering storage node voltage $V_{SN}$ from the logical "1" voltage (when writing a logical "0"). In effect, the reduction in upper supply voltage $V_{DD}$ weakens the latch formed by NDR FETs 120 and 130, thereby allowing data to be more easily (and therefore more quickly) written into SRAM cell 100. Again, the particular control circuitry for altering the bias voltages to the cell in response to such conditions will be apparent to those skilled in the art.

As also alluded to earlier, in other embodiments it may be desirable to maintain upper supply voltage $V_{DD}$ at elevated upper supply voltage $V_{DD\ STORAGE}$ during read operations. By reducing NDR valley current for NDR FET 130, elevated upper storage voltage $V_{DD\ STORAGE}$ strengthens the latching effect provided by NDR FETs 120 and 130, thereby enabling the performance of faster read operations to SRAM cell 100. Note that a similar latch strengthening provided by increased upper supply voltage $V_{DD}$ during the storage mode of operation enhances data storage reliability (in addition to reducing static power consumption as described above).

Note that the concept of weakening a latching effect during write operations and strengthening the latching effect during storage and/or read operations can beneficially be applied to any type of SRAM cell that includes a latching circuit. In addition, in various other embodiments, this latch weakening/strengthening can be performed using any other available techniques (e.g., by adjusting gate bias (i.e., gate-to-source voltage) and/or body bias (i.e., body-to-source voltage) to weaken latching effect (e.g., by decreasing peak current) during write operations and/or strengthen latching effect (e.g., by increasing peak current) during storage and/or read operations).

Note further that while the supply voltage bias manipulations described above are described with respect to changes in upper supply voltage $V_{DD}$ for exemplary purposes, in various other embodiments, the supply voltage bias can be adjusted via changes in lower supply voltage $V_{SS}$ (either in conjunction with, or in place of, changes in upper supply voltage $V_{DD}$), in the manner illustrated in FIG. 2 of U.S. Pat. No. 6,529,400. For example, a lower supply voltage $V_{SS}$ supplied to SRAM cell 100 during its storage mode of operation can be changed to a reduced lower supply voltage $V_{SS\ storage} = V_{SS\ NOMINAL} - \Delta_3$ V, where $\Delta_3$ V is equal to a positive voltage increment. The net effect of such a decrease in lower supply voltage $V_{SS}$ is an increase the source/drain voltage across pull-up NDR FET 130 (for a stored logic "0") and an increase in the source/drain voltage across pull-down NDR FET 120 (for a stored logic "1"), which in turn increases the NDR effect to cause a reduction in static current consumption. As with the boosting of upper supply voltage $V_{DD}$ noted earlier, the change in lower supply voltage $V_{SS}$ can be made in response to a WORD line transition as noted in the aforementioned U.S. Pat. No. 6,529,400, or based on some other similar technique which will be apparent to those skilled in the art from the present teachings.

From a practical consideration, $V_{NDR}$ preferably should be based on and set to $V_{BIT\ HIGH}/2$ for optimal cell operation, where $V_{BIT\ HIGH}$ is the high voltage on the BIT line, rather than being based on the power-supply voltage $V_{DD}$ to SRAM cell 100. If this is not possible, then $V_{SS}$ can be set to $V_{SSWRITE} = V_{NDR} - V_{BIT\ HIGH}/2$ (not shown) and the cell power supply voltage $V_{DD}$ can be set to $V_{DDWRITE} = V_{NDR} + V_{BIT\ HIGH}/2$ (not shown) during write operations. The flexibility of the present invention for accommodating a variety of SRAM cell requirements will be apparent to those skilled in the art.

In various other embodiments, a body-bias voltage $V_{BODY}$ shown in FIG. 1 can also be varied during certain operational periods to improve cell performance. An exemplary body-biasing scheme is also shown in FIG. 3C. By boosting $V_{BODY}$ above a nominal value of 0 V (or ground) $V_{BODY\ NOMINAL}$ to a value $V_{BODY\ READ} = V_{BODY\ NOMINAL} + \Delta_4 V$, a threshold voltage ($V_T$) of FETs in SRAM cell 100 will be lowered. This in turn will enhance transistor drive current for both NDR FETs 120 and 130 and access transistor 110 for a faster read operation, in a manner similar to that discussed above for the other read enhancement methods. While an NDR threshold voltage ($V_{NDR}$) would be increased for NDR FETs 120, 130 this should not present a problem during read periods.

Conversely, reducing $V_{BODY}$ below a nominal value of 0 V (or ground) to a value $V_{BODY\ STORAGE} = V_{BODY\ NOMINAL} - \Delta_5 V$, will increase a threshold voltage ($V_T$) of FETs (110, 120, and 130) in SRAM cell 100. In some embodiments, $V_{BODY}$ can be set to $-V_{DD}$. This would have the effect of reducing valley/leakage current for NDR and access transistors, for lower standby (storage) power. Note however, that an NDR threshold voltage ($V_{NDR}$) would be reduced, and this would in turn reduce a static noise margin. Nonetheless, this may be still acceptable in some applications.

The precise values for the aforementioned nominal voltages, $V_{DD\ STORAGE}$, $V_{SS\ STORAGE}$, $V_{DD\ WRITE}$, $V_{SS\ WRITE}$, $V_{BODY\ STORAGE}$ and $V_{BODY\ READ}$ for a specific implementation will be determinable through routine design and modeling techniques, and will be a function of desired performance characteristics for a particular memory cell, including speed, power consumption, operating margin, etc. It is expected that such parameters will also be a function of a manufacturing process used to make such devices.

In some instances it may be desirable to achieve a constant PVR despite changes in $V_{GS}$. This can be done (as noted above) by appropriately adjusting $V_{DD\ STORAGE}$ in response to gate bias (i.e., gate-to-source) voltage $V_{GS}$, so that the NDR characteristic effects due to the supply voltage bias change compensate for the gate bias effects. Consequently, gate bias voltage $V_{GS}$ during a read/write operation can be paired with a certain upper supply voltage $V_{DD}$, while gate bias voltage $V_{GS}$ during a storage operation can be paired with a different upper supply voltage $V_{DD}$ (e.g., $V_{DD\ STORAGE}$) to achieve a constant PVR. In still other embodiments it may be desirable to vary the cell PVR during read, write and storage operations, so that different PVRs are attained in each mode. Other examples will be apparent to those skilled in the art, and all of these approaches can be implemented using well-known techniques.

The power supply biasings are therefore changed in time for cell 100, depending on a mode of operation. A control circuit for achieving this in a read context is illustrated in U.S. Pat. Publication No. 2003/0147272 also incorporated by reference herein. The same type of pulsing power supply for both boosting $V_{DD}$ and reducing $V_{SS}$ during other periods, including write and storage periods, can be effectuated by modifying the circuit shown in FIG. 3 therein. Other specific approaches will be apparent to those skilled in the art.

The advantage over the structure and methods depicted in U.S. Pat. No. 6,529,400 and Publication No. 2003/0147272 include the fact, of course, that the present invention is useable in NDR embodiments, and is useable for n-channel based pull-up elements. Moreover, unlike such reference, the present invention teaches additional useful biasing techniques for use during operations other than merely reads, such as storage and write operations. These methods are useful even in non-NDR embodiments as they increase an overall cell static noise margin.

As with the other figures above, it will be understood by those skilled in the art that the timing as shown in FIG. 3C is merely exemplary, and that other variations could be beneficially employed with the present invention. For example, the delay between the activation of the WORD line and change in the cell supply bias voltage may be varied in accordance with desired circuit performance characteristics.

Moreover, the diagram of FIG. 3C is not intended to be to scale, so the initiation, slew rate, amplitude and duration of the signals shown can be varied without departing from the spirit of the present invention. The signal relationships are also drawn in an exaggerated form to help illuminate the operation of the invention, and may or may not be used in this particular fashion in a commercial product. Again, the various circuits 160 (FIG. 4) required to implement the timing of FIG. 3C, including the generation of the cell supply bias voltages in response to an initiation (with or without delay of a read operation, a write operation, and the altering of such nominal voltage values can be constructed by a variety of means through ordinary design skill. The particulars of such circuit are not material to the present teachings, so the invention is by no means limited to any particular implementation of the same.

Looked at from another perspective, this facet of the present invention can be thought of as temporarily enhancing an NDR behavior during certain operational time periods for a memory cell, such as during a storage operation. Again, in many applications, this will have the benefit of actually reducing the NDR FET current consumption, and thus cell current consumption, during the time the cell is storing data, as the NDR FET is shut off even more by an NDR effect. At extreme levels of $V_{DD\ storage}$ the NDR effect will be countered of course by leakage current, and it is expected that optimal settings for $V_{DD\ storage}$ will be determined on a circuit by circuit basis, again, based on conventional design and testing techniques.

In addition, the cell supply bias voltage enhancement of the invention can be used in other cell embodiments, including in architectures which only use an NDR element for a pull-up function, or a pull-down function. In other words, the present invention is broad enough to encompass any embodiments in which an NDR behavior is enhanced during a storage operation to reduce channel current, such as by increasing a source/drain bias as shown above. For example, an NDR element used as a pull-up or a load element in a DRAM cell or logic circuit could use the techniques of the present invention where it is desirable to increase an NDR effect.

Other methods of increasing the NDR behavior will be apparent to those skilled in the art, since the NDR behavior of the aforementioned FET is a function of the trapping and detrapping rate of electrons in the channel. Thus, a separate body bias signal may be adjusted during a storage operation to increase an NDR performance.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

The invention claimed is:

1. A method of operating a static random access memory (SRAM) cell, wherein the SRAM cell includes a latching circuit comprising a negative differential resistance (NDR) device connected to a storage node, the method comprising:
   supplying a first voltage potential across the latching circuit while the SRAM cell is operating in a data storage mode; and
   supplying a second voltage potential across the latching circuit during a write operation to the data storage node,
   wherein a first NDR valley current for the NDR device when the first voltage potential is supplied across the latching circuit is less than a second NDR valley current for the NDR device when the second voltage potential is supplied across the latching circuit.

2. The method of claim 1, wherein the first voltage potential is greater than the second voltage potential.

3. The method of claim 2, wherein the NDR device comprises a first NDR field effect transistor (FET),
   wherein the latching circuit further comprises a second NDR FET, wherein a source of the first NDR FET is connected to the data storage node, wherein a drain of the second NDR FET is connected to the data storage node, wherein supplying the first voltage potential comprises supplying a first voltage to a drain of the first NDR FET and supplying a second voltage to a source of the second NDR FET, and wherein supplying the second voltage potential comprises supplying a third voltage to the drain of the first NDR FET and supplying a fourth voltage to the source of the second NDR FET.

4. The method of claim 3, wherein the first voltage is greater than the third voltage.

5. The method of claim 3, wherein the second voltage is less than the fourth voltage.

6. The method of claim 4, further comprising supplying a third voltage potential across the latching circuit during a read operation to the data storage node, wherein a third NDR valley current for the first NDR FET when the third voltage potential is supplied across the latching circuit is less than the second NDR valley current.

7. The method of claim 6, wherein the third voltage potential is greater than the second voltage potential.

8. The method of claim 6, wherein the third voltage potential is equal to the first voltage potential.

9. A method for operating a static random access memory (SRAM) cell, the SRAM cell comprising a latch circuit for data storage, the method comprising:

adjusting the latch circuit to operate with a first latching strength while the SRAM cell is operating in a data storage mode; and adjusting the latch circuit to operate with a second latching strength while the SRAM cell is operating in a data write mode, wherein the first latching strength is greater than the second latching strength.

10. The method of claim 9, wherein the latch circuit comprises a negative differential resistance (NDR) device connected to a data storage node, wherein adjusting the latch circuit to operate with the first latching strength comprises supplying a first voltage potential across the latch circuit, wherein adjusting the latch circuit to operate with the second latching strength comprises supplying a second voltage potential across the latch circuit, and wherein a first NDR valley current for the NDR device when the first voltage potential is supplied across the latch circuit is less than a second NDR valley current for the NDR device when the second voltage potential is supplied across the latch circuit.

11. The method of claim 10, wherein the first voltage potential is greater than the second voltage potential.

12. The method of claim 11, wherein the NDR device comprises a first NDR field effect transistor (FET), wherein the latch circuit further comprises a second NDR FET, wherein a source of the first NDR FET is connected to the data storage node, wherein a drain of the second NDR FET is connected to the data storage node, wherein supplying the first voltage potential comprises supplying a first voltage to a drain of the first NDR FET and supplying a second voltage to a source of the second NDR FET, and wherein supplying the second voltage potential comprises supplying a third voltage to the drain of the first NDR FET and supplying a fourth voltage to the source of the second NDR FET.

13. The method of claim 12, wherein the first voltage is greater than the third voltage.

14. The method of claim 12, wherein the second voltage is less than the fourth voltage.

15. The method of claim 9, further comprising adjusting the latch circuit to operate with a third latching strength while the SRAM cell is operating in a data read mode, wherein the third latching strength is greater than the second latching strength.

16. The method of claim 15, wherein the latch circuit comprises a negative differential resistance (NDR) device connected to a data storage node, wherein adjusting the latch circuit to operate with the first latching strength comprises supplying a first voltage potential across the latch circuit, wherein adjusting the latch circuit to operate with the second latching strength comprises supplying a second voltage potential across the latch circuit, the first voltage potential being greater than the second voltage potential, and wherein adjusting the latch circuit to operate with the third latching strength comprises supplying a third voltage potential across the latch circuit, the third voltage potential being greater than the second voltage potential.

17. The method of claim 16, wherein the first voltage potential is equal to the third voltage potential.

18. The method of claim 9, wherein the latch circuit comprises a negative differential resistance (NDR) device and a data storage node connected to a first conduction terminal of the NDR device, wherein adjusting the latch circuit to operate with the first latching strength comprises applying a first gate bias to the NDR device, wherein adjusting the latch circuit to operate with the second latching strength comprises supplying a second gate bias to the NDR device, and wherein a first peak current for the NDR device when receiving the first gate bias is greater than a second peak current for the NDR device when receiving the second gate bias.

19. A memory circuit comprising:

a static random access memory (SRAM) cell comprising a latching circuit and a transfer element, the latching circuit comprising a negative differential resistance (NDR) element connected to a data storage node, and the transfer element being coupled between a bit line and the data storage node; and a biasing circuit for supplying a first voltage potential across the latching circuit while the transfer element is turned off, and for supplying a second voltage potential across the latching circuit while the transfer element is transferring data from the bit line to the storage node, wherein a first NDR valley current of the NDR element while the first voltage potential is supplied across the latching circuit is less than a second NDR valley current of the NDR element while the second voltage potential is supplied across the latching circuit.

20. The SRAM cell of claim 19, wherein the first voltage potential is greater than the second voltage potential.

21. The SRAM cell of claim 20, wherein the NDR element comprises a first NDR field effect transistor (FET).

22. The SRAM cell of claim 21, wherein the latching circuit further comprises a second NDR FET,
   wherein a source of the first NDR FET is connected to the data storage node, and
   wherein a drain of the second NDR FET is connected to the data storage node.

23. The SRAM cell of claim 19, wherein the biasing circuit further supplies a third voltage potential across the latching circuit while the transfer element is transferring data from the data storage node to the bit line, wherein a third NDR valley current of the NDR element while the third voltage potential is supplied across the latching circuit is less than the second NDR valley current.

24. The SRAM cell of claim 23, wherein the first voltage potential is greater than the second voltage potential, and
   wherein the third voltage potential is greater than the second voltage potential.

* * * * *